US008546265B2

(12) United States Patent
Nozawa et al.

(10) Patent No.: US 8,546,265 B2
(45) Date of Patent: Oct. 1, 2013

(54) METHOD, APPARATUS AND PROGRAM FOR MANUFACTURING SILICON STRUCTURE

(75) Inventors: Yoshiyuki Nozawa, Nishinomiya (JP); Takashi Yamamoto, Takarazuka (JP)

(73) Assignee: SPP Technologies Co., Ltd., Tokyo (JP)

( * ) Notice: Subject to any disclaimer, the term of this patent is extended or adjusted under 35 U.S.C. 154(b) by 346 days.

(21) Appl. No.: 12/997,942

(22) PCT Filed: Apr. 8, 2009

(86) PCT No.: PCT/JP2009/057171
§ 371 (c)(1),
(2), (4) Date: Dec. 14, 2010

(87) PCT Pub. No.: WO2009/154034
PCT Pub. Date: Dec. 23, 2009

(65) Prior Publication Data
US 2011/0097903 A1    Apr. 28, 2011

(30) Foreign Application Priority Data

Jun. 18, 2008 (JP) .................................. 2008-158869

(51) Int. Cl.
*H01L 21/3065* (2006.01)
*B81C 1/00* (2006.01)

(52) U.S. Cl.
CPC ....... *B81C 1/00619* (2013.01); *H01L 21/30655* (2013.01); *B81C 1/00531* (2013.01); *H01L 21/3065* (2013.01); *B81C 1/00626* (2013.01); *B81B 2203/033* (2013.01)
USPC .......... 438/714; 438/695; 438/696; 438/706; 438/734; 438/719; 216/58; 216/67; 257/E21.214; 257/E21.218; 257/E21.245; 257/E21.252; 257/E21.305

(58) Field of Classification Search
CPC .................... H01L 21/3065; H01L 21/30655; B81C 1/00515; B81C 1/00619; B81C 1/00625; B81B 2203/00515
USPC ............ 438/706–744, 695, 696; 216/58–81; 257/E21.214, E21.218, E21.245, E21.252, 257/E21.305
See application file for complete search history.

(56) References Cited

U.S. PATENT DOCUMENTS

| 6,051,503 A * | 4/2000 | Bhardwaj et al. ............. 438/705 |
| 6,593,244 B1 * | 7/2003 | Wang et al. ................... 438/706 |
| 6,759,340 B2 * | 7/2004 | Nallan et al. ................. 438/714 |
| 2004/0084406 A1 * | 5/2004 | Kamp et al. ................... 216/59 |

(Continued)

FOREIGN PATENT DOCUMENTS

| JP | 2002-158214 | 5/2002 |
| JP | 2006-148156 | 6/2006 |

*Primary Examiner* — Lan Vinh
*Assistant Examiner* — David Kaufman
(74) *Attorney, Agent, or Firm* — Marvin A. Motsenbocker; Mots Law, PLLC (57) ABSTRACT

A method for manufacturing a silicon structure according to the present invention includes, in a so-called dry-etching process wherein gas-switching is employed, the steps of: etching a portion in the silicon region at a highest etching rate under a high-rate etching condition such that the portion does not reach the etch stop layer; subsequently etching under a transition etching condition in which an etching rate is decreased with time from the highest etching rate in the high-rate etching condition; and thereafter, etching the silicon region under a low-rate etching condition of a lowest etching rate in the transition etching condition.

6 Claims, 7 Drawing Sheets

(56) References Cited

U.S. PATENT DOCUMENTS

2004/0092118 A1* 5/2004 Johnson et al. ............... 438/696
2006/0006139 A1* 1/2006 Johnson et al. ................ 216/60
2008/0078948 A1* 4/2008 Saito .......................... 250/492.2

* cited by examiner

METHOD, APPARATUS AND PROGRAM FOR MANUFACTURING SILICON STRUCTURE

TECHNICAL FIELD

The present invention relates to a method, an apparatus, and a program for manufacturing a silicon structure.

BACKGROUND ART

The technical field has been rapidly enhancing to which MEMS (Micro Electro Mechanical Systems) devices using silicon are applied. In recent years, the technique has been applied not only to microturbines and sensors but also to the information and communication fields and the medical field. One of the main technical elements supporting this MEMS technique is anisotropic dry etching of silicon, and developments in the MEMS technique are recognized to be supported by developments in this technical element. The anisotropic dry etching of silicon has technically progressed remarkably for the last few years. However, there are still increasing demands for formation of an aperture of a high aspect ratio. Recently, upon formation of trenches or holes, strict demands have arisen to etched shapes such as the shape of a side wall in addition to the aspect ratio. Particularly in a case of forming a silicon structure with use of a substrate (such as an SOI substrate) provided with an etch stop layer, it is quite difficult to satisfy demands for high verticality as well as a side wall in an excellent shape, in other words, elimination of unordinary shaping of the side wall.

As a conventional measure for forming in such a silicon substrate provided with an etch stop layer a trench or a hole of an aperture having high verticality and a side wall in an excellent shape, there have been disclosed by the applicants of the present application and the like methods of etching by utilizing two frequencies upon application of an electric power to the silicon substrate (Patent Documents 1 and 2). However, the above methods were made for elimination of an unordinary shape referred to as a "notch" in the vicinity of an interface between an etch stop layer and a silicon layer, and consideration has not been sufficiently made to the influence of the change in frequency of the electric power applied to the substrate on the shapes of side walls other than the "notch".

PRIOR ART DOCUMENTS

Patent Documents

Patent Document 1: Japanese Unexamined Patent Publication No. 2006-148156
Patent Document 2: Japanese Unexamined Patent Publication No. 2002-158214

SUMMARY OF THE INVENTION

Problem to be Solved by the Invention

Figure 6A:
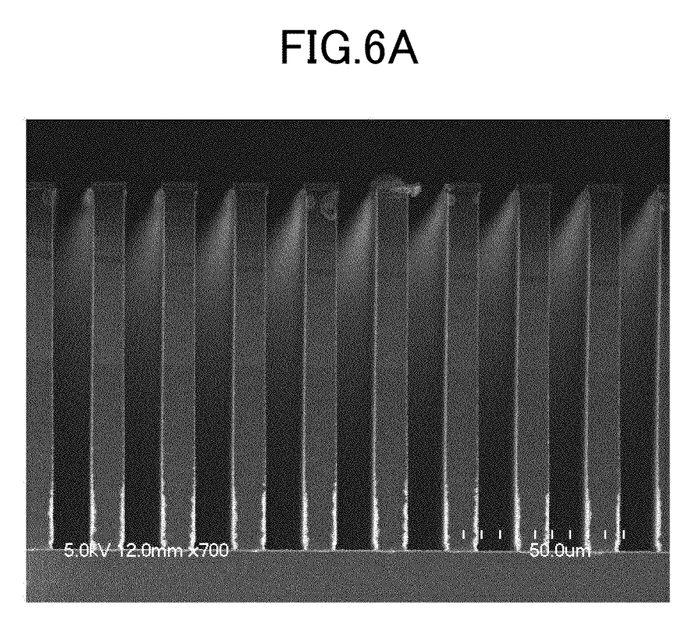
FIG. 6A is a SEM picture showing shapes of side walls of trenches provided in a silicon structure in which unordinary shaping occurs in the side walls, according to a conventional example.
Figure 6B:
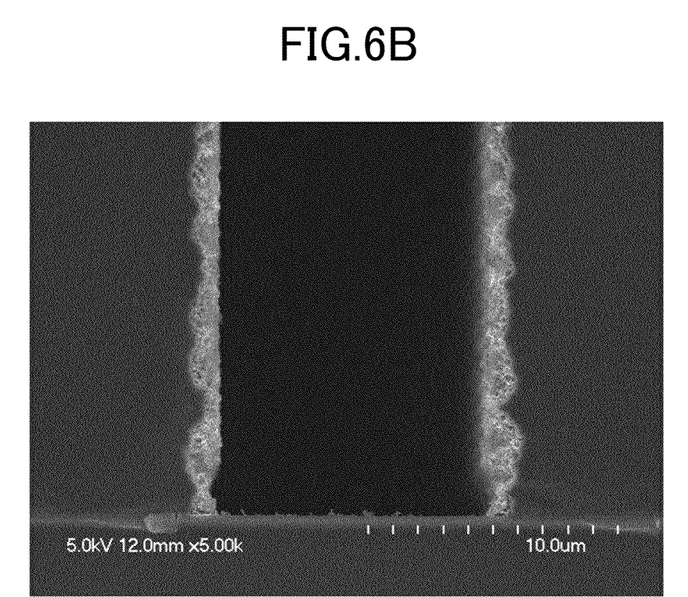
FIG. 6B is a SEM picture showing a shape of a side wall in the vicinity of an interface between a silicon layer and an etch stop layer in a trench provided in a silicon structure in which unordinary shaping occurs in the side wall, according to a conventional example.

In anisotropic etching of a silicon layer in a silicon substrate provided with an etch stop layer, which is typically exemplified by an SOI (Silicon on insulator) substrate, it has been a conventional and main technical issue to improve a shape of a side wall in the vicinity of an interface between the etch stop layer (such as a silicon dioxide film layer serving as a base) and the silicon layer, that is, reduction of notches. In this regard, sufficient consideration has not been made to the influence of the change in frequency on the shape of the side wall described above, more specifically, ununiformity in the shapes of the side walls at portions of etching depths shallower relative to the vicinity of the interface between the base layer and the silicon layer. It is because such ununiformity has not been a dominant problem to the properties of devices as final products (such as a vibrating gym sensor). However, for example, extremely high sensibility has been required to the vibrating gyro sensors in recent years, and it was found that the side wall in the unordinary shape described above possibly inhibits improvement in property of the gyro sensor as the unordinary shape changes the weight of a vibrating body thereof. FIGS. 6A and 6B are cross sectional SEM pictures each showing an exemplary silicon structure in which side walls have such unordinary shapes.

Such an unordinary shape of a side wall other than a notch is formed, for example, in the process of anisotropic etching and after some of trenches or holes reach the etch stop layer. For example, in a case where silicon is provided on a surface thereof with an etching mask (such as a photoresist mask) having a plurality of apertures in different sizes, the etching rates are varied depending on the sizes of the portions to be etched (apertures), which is called as the micro-loading effect. In this case, when a trench or a hole being etched reaches the etch stop layer, radicals and the like in a plasma, which have been used for etching the silicon, are not required any more, thereby resulting in a change in plasma state. Even under constant conditions on the kind or the volume of a gas supplied into an etching process chamber, side walls of trenches or holes that have not yet reached the etch stop layer are to be shaped differently from the shape formed before the change in plasma state. In a case where the etching rates are variously varied in a single etching target, a portion of the highest etching rate initially reaches the etch stop layer, and portions of different etching rates reach the etch stop layer one after another, thereby causing continuous changes in plasma state.

More interestingly, the above problem may occur even in a case where a substrate is provided on a surface thereof with an etching mask having a plurality of apertures in an identical shape. More specifically, the etching rates are varied depending on some property of an etching device, such as cooling ununiformity in a surface of a silicon substrate. As a result, timings of reaching the etch stop layer are different from one another at different portions in the surface of the substrate to be etched.

As described above, in etching a silicon substrate provided with an etch stop layer, it is quite difficult to match the timings for trenches or holes being etched to reach the etch stop layer in the entire surface of the substrate. Therefore, the plasma state is inevitably varied until the etching is completed.

Solutions to the Problem

The present invention solves the technical problem to achieve high verticality as well as a side wall in an excellent shape, and contributes to further improvement in the performance of anisotropic dry etching of silicon provided with an etch stop layer.

The inventors intensively studied the conventional etching method utilizing two frequencies in view of the fact that a side wall in an unordinary shape described above affects largely on the properties of various devices expected to have high performances. The inventors eventually found that unordinary shaping of a side wall due to the change in plasma state cannot be suppressed by changing an etching condition after some of trenches or holes being etched reach an etch stop layer. Taking into consideration the fact that sensitive to the change in plasma state are not only the shape of the interface between the silicon and the etch stop layer but also the shape of the side wall, the inventors found that the depth of etching and the etching condition need to be accurately controlled in accordance with the thickness or the distance of the silicon to the etch stop layer, in order to eliminate the micro-loading effect and variations in etching rate in the entire surface.

More specifically, it was found that the following processing effectively solves the above problem. At a first stage, it is necessary to improve the processing rate in the entire process by maintaining the etching rate even if the amount of wear on the etching mask per unit time period is increased to some extent. Therefore adopted is a high-rate etching condition.

Then, after some progress in the etching process, there is adopted a transition etching condition at a second stage so as to gradually decrease the etching rate. In this case, the processing is made under a condition of a low etching rate, in other words, a condition of a low etching capability, before occurrence of a change in plasma state. Accordingly found was that a remarkable change in the shape of the side wall due to a rapid change in etching condition does not substantially occur.

Further, at the final stage (a third stage) slightly before the trench or the hole at the portion of the highest etching rate in the substrate to be etched reach the etch stop layer, there is adopted a condition of the lowest etching rate (a low-rate etching condition) out of the etching rates under the transition etching condition at the second stage described above. In this case, the processing is maintained in a state of the lowest etching capability, and found as a result was that the occurrences of unordinary shaping of the side wall as well as of unordinary shaping of the interface between the silicon and the etch stop layer can be suppressed. The present invention was made on the basis of the above findings.

A method for manufacturing a silicon structure according to the present invention includes, in a process of etching a silicon region in a substrate provided with an etch stop layer with use of plasmas generated by alternately supplying an etching gas and an organic deposit forming gas, the steps of etching a portion in the silicon region at a highest etching rate under a high-rate etching condition such that the portion does not reach the etch stop layer; subsequently etching under a transition etching condition in which an etching rate is decreased with time-dependently from the highest etching rate in the high-rate etching condition; and thereafter, etching the silicon region under a low-rate etching condition of a lowest etching rate in the transition etching condition.

A program for manufacturing a silicon structure according to the present invention includes, in a process of etching a silicon region in a substrate provided with an etch stop layer with use of plasmas generated by alternately supplying an etching gas and an organic deposit forming gas, the steps of: etching a portion in the silicon region at a highest etching rate under a high-rate etching condition such that the portion does not reach the etch stop layer; subsequently etching under a transition etching condition in which an etching rate is decreased with time-dependently from the highest etching rate in the high-rate etching condition; and thereafter, etching the silicon region under a low-rate etching condition of a lowest etching rate in the transition etching condition.

Further, an apparatus for manufacturing a silicon structure according to the present invention includes a control unit that controls with use of the above program for manufacturing a silicon structure or a recording medium on which the program for manufacturing a silicon structure is stored.

In the present application, the "high-rate etching condition" is selected in accordance with, for example, a ratio of a silicon region in an entire substrate to be etched, in other words, an aperture ratio of an etching mask, so as to realize a high etching rate that does not cause unordinary shaping. The "transition etching condition" in the present application is adopted in a so-called transition period until reaching the "low-rate etching condition" to be described later, and the etching rate is set so as to be gradually decreased with time. More specifically, this "transition etching condition" is selected in consideration of the fact that, in a silicon region to be etched, the area of exposure (a substantial aperture ratio) of the silicon is reduced with time after a portion of the highest etching rate penetrates to reach the etch stop layer. The "low-rate etching condition" in the present application typically adopts the lowest etching rate out of the etching rates under the transition etching condition. As an example, the etching conditions are set such that the etching rate under the "high-rate etching condition" is applied to approximately a half portion of the predetermined silicon region to be etched until the silicon etching process proceeds substantially to reach a middle position in the predetermined silicon region.

In the present application, the "holes" indicate apertures in round shapes as well as in elliptical and quadrangular shapes in the outermost surface of a substrate in accordance with a mask pattern. More specifically, the "holes" in the present application include, for example, quadrangular apertures in which a shorter side and a longer side have a ratio of 1 to 3 or less. The "trenches" in the present invention indicate apertures other than the "holes".

Effects of the Invention

With the manufacturing method, the manufacturing apparatus, or the manufacturing program according to the present invention, dry etching of silicon provided with an etch stop layer achieves high verticality as well as significant reduction of unordinary shaping of side walls.

MODE FOR CARRYING OUT THE INVENTION

An embodiment of the present invention will be described in detail with reference to the accompanying drawings. In this description, common parts are denoted by common reference symbols in all the drawings unless otherwise specified. Further, the elements in the present embodiment are not necessarily illustrated according to the same scale in the drawings. Some of the symbols may not be indicated in the drawings for the purpose of simplification in the appearances thereof. Flow rates of various gases to be mentioned below are under a normal condition unless otherwise specified.

Figure 1:
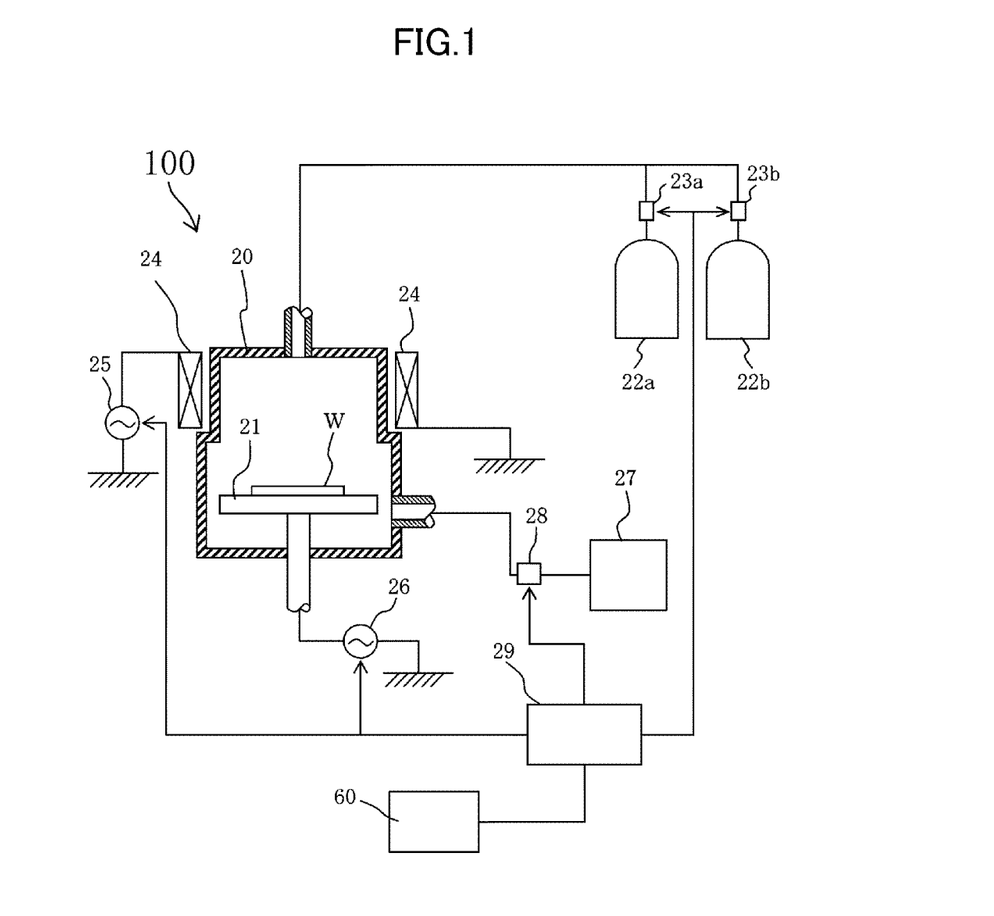
FIG. 1 is a cross sectional view showing a configuration of an apparatus for manufacturing a silicon structure according to an embodiment of the present invention.
Figure 2A:
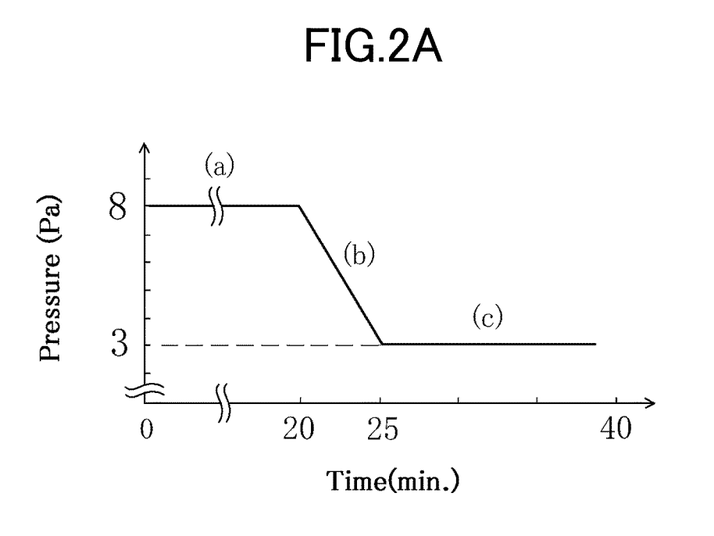
FIG. 2A is a graph indicative of changes with time of a pressure of an etching gas in a process of etching a silicon substrate provided with an etch stop layer according to the embodiment of the present invention.
Figure 2B:
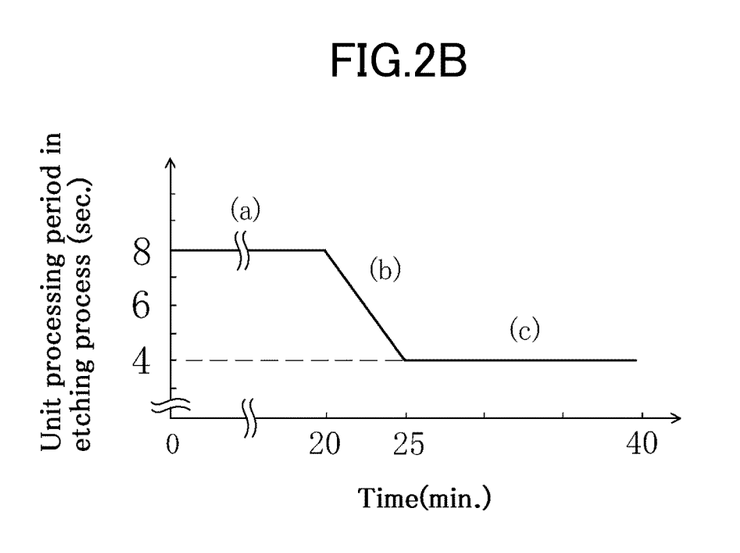
FIG. 2B is a graph indicative of a unit processing period in the process of etching the silicon substrate provided with the etch stop layer according to the embodiment of the present invention.

FIG. 1 is a cross sectional view showing an exemplary configuration of an apparatus 100 for manufacturing a silicon structure (hereinafter, simply referred to also as a manufacturing apparatus 100) according to the present embodiment. FIG. 2A is a graph indicative of changes with time of a pressure of an etching gas in a process of etching a silicon substrate W provided with an etch stop layer made of a silicon dioxide film (hereinafter, simply referred to also as the silicon substrate W) in the present embodiment. FIG. 2B is a graph indicative of changes with time of a unit processing period in the above etching process. FIGS. 3A to 3D are cross sectional views each showing a process in a method for manufacturing a silicon structure 10 according to the present embodiment.

Firstly described is the configuration of the apparatus 100 for manufacturing a silicon structure as shown in FIG. 1. The silicon substrate W to be etched, which is provided with an etch stop layer 18, is placed on a stage 21 that is disposed in a lower part of a chamber 20. Supplied to the chamber 20 from each of cylinders 22a and 22b through gas flow rate regulators 23a and 23b is at least a gas of one kind selected out of an etching gas and an organic deposit forming gas (hereinafter, also referred to as a passivation film forming gas). These gases are plasmatized with use of a coil 24 to which a first high-frequency power supply 25 applies a high-frequency electric power. Then, a second high-frequency power supply 26 applies a high-frequency electric power to the stage 21, so that these plasmas thus generated are taken into the silicon substrate W. In the present embodiment, applied to the stage 21 is the electric power in a pulsed state, in other words, in a state where application is on and off repeatedly at predetermined intervals. The chamber 20 is connected with a vacuum pump 27 by way of an exhaust flow rate regulator 28 so as to thereafter reduce the pressure in the chamber 20 as well as to exhaust a gas generated after the process. The flow rate of the gas exhausted from the chamber 20 is changed by the exhaust flow rate regulator 28. There is provided a control unit 29 that controls the gas flow rate regulators 23a and 23b, the first high-frequency power supply 25, the second high-frequency power supply 26 capable of pulsed application, and the exhaust flow rate regulator 28, which are described above.

Described next is the processes of manufacturing the silicon structure 10 according to the present embodiment. The silicon structure 10 according to the present embodiment is provided with trenches that are etched to reach the etch stop layer so as to have approximately 100 μm and approximately 10 μm in width, respectively, as well as to have approximately 100 μm in depth.

The present embodiment adopts a method of anisotropic dry etching of silicon, in which a protective film formation process of supplying the passivation film forming gas and an etching process of supplying the etching gas are repeated sequentially. In the present embodiment, there are adopted $C_4F_8$ as the passivation film forming gas and $SF_6$ as the etching gas.

The present embodiment has three etching conditions which have etching rates different from one another. Firstly, under a high-rate etching condition, the passivation film forming gas is supplied at 200 mL/min and the pressure in the chamber 20 is regulated to 5 Pa in a unit processing period of 2 seconds in the protective film formation process. A high-frequency electric power at 13.56 MHz of 1800 W is applied to the coil 24, while no electric power is applied to the stage 21. On the other hand, in the subsequent etching process, the etching gas is supplied at 40 mL/min. As indicated in a time period (a) in FIG. 2A, the pressure in the chamber 20 is regulated to 8 Pa for 20 minutes from the start of etching. As indicated in the time period (a) in FIG. 2B, the unit processing period is fixed to 8 seconds for 20 minutes from the start of etching. In this period, applied to the coil 24 is a high-frequency electric power at 13.56 MHz of 2200 W. Applied to the stage 21 is a high-frequency electric power at 380 kHz of 45 W. Under the high-rate etching condition according to the present embodiment, the etching rate is about 10 μm/min (micrometers/minute) at the trench of approximately 100 μm in width (where the etching rate is the fastest), while the etching rate is about 6 μm/min at the trench of approximately 10 μm in width.

Figure 3A:
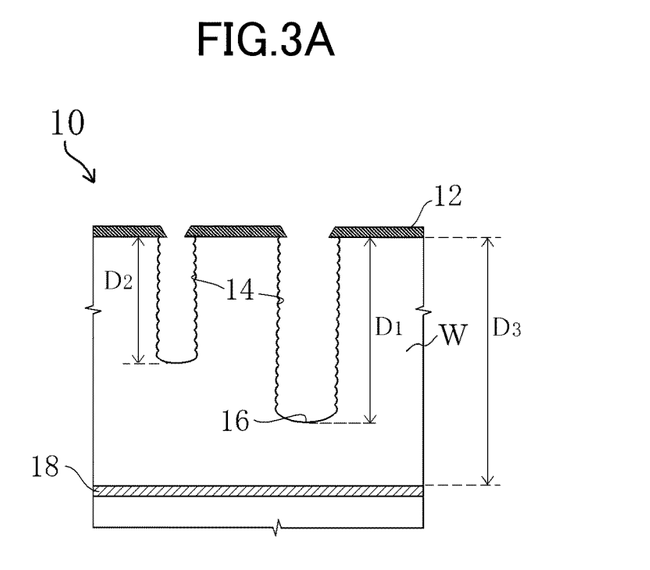
FIG. 3A is a cross sectional view showing a process in a method for manufacturing a silicon structure according to an embodiment of the present invention.

FIG. 3A is a cross sectional view of the silicon structure 10 that is etched under the high-rate etching condition. In the present embodiment, an etching mask is provided with two portions of apertures having widths different from each other. Accordingly, due to the micro-loading effect described earlier, the trench of the aperture having the larger width has a depth ($D_1$) that is larger than a depth ($D_2$) of the other trench. In this case, in the trenches formed under the high-rate etching condition, each of the portions formed at the fastest etching rate is etched to have a depth of 85% or less relative to a depth ($D_3$) of a silicon layer to be etched.

Then, after 20 minutes from the start of the etching process, there is adopted a transition etching condition. In the protective film formation process under the transition etching condition, the passivation film forming gas is supplied at 200 mL/min and the pressure in the chamber 20 is regulated to 5 Pa in a unit processing period of 2 seconds. A high-frequency electric power at 13.56 MHz of 1800 W is applied to the coil 24, while no electric power is applied to the stage 21. On the other hand, in the etching process, as indicated in a time period (b) in FIG. 2A, for 5 minutes from the end of the high-rate etching condition, the pressure in the chamber 20 is regulated to be gradually reduced by the exhaust flow rate regulator 28 that is instructed by the control unit 29, and eventually reaches 3 Pa. Further, as indicated in the time period (b) in FIG. 2B, the unit processing period is controlled by the control unit 29 so as to be gradually shortened from 8 seconds to 4 seconds for 5 minutes from the end of the high-rate etching condition. The etching gas is supplied at 400 mL/min. In this period, applied to the coil 24 is a high-frequency electric power at 13.56 MHz of 2200 W. Applied to the stage 21 is a high-frequency electric power at 380 kHz of 45 W. Under the transition etching condition according to the present embodiment, the etching rate is gradually decreased from about 10 μm/min to about 5.5 μm/min at the trench of approximately 100 μm in width, while the etching rate is gradually decreased from about 6 μm/min to about 3 μm/min at the trench of approximately 10 μm in width. The transition etching is preferably performed for a period of 5 cycles or more of the unit processing period under a low-rate etching condition. If the period for the transition etching is shorter than the above, there occurs unordinary shaping of side walls.

Figure 3B:
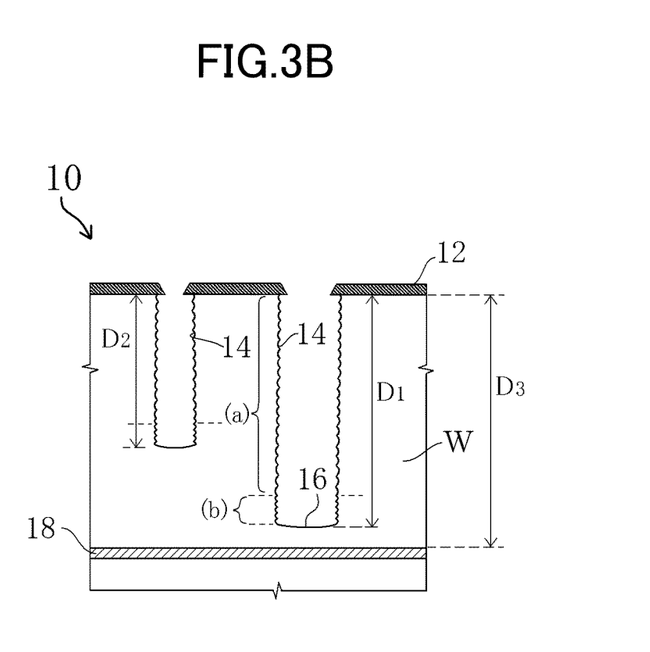
FIG. 3B is a cross sectional view showing a process in the method for manufacturing the silicon structure according to the embodiment of the present invention.

FIG. 3B is a cross sectional view of the silicon structure 10 that is etched under the high-rate etching condition as well as under the transition etching condition. There is formed a region (a) of each of the trenches under the high-rate etching condition, and is then formed a region (b) of the trench under the transition etching condition. In the present embodiment, in the trenches formed under the high-rate etching condition and the transition etching condition, each of the portions formed at the fastest etching rate is etched to have a depth of 95% or less relative to the depth ($D_3$) of the silicon layer to be etched.

The low-rate etching condition is adopted after 25 minutes from the start of the etching process. In the protective film formation process under the low-rate etching condition, the passivation film forming gas is supplied at 200 mL/min and the pressure in the chamber 20 is regulated to 5 Pa in a unit processing period of 2 seconds. A high-frequency electric power at 13.56 MHz of 1800 W is applied to the coil 24, while no electric power is applied to the stage 21. On the other hand, in the etching process, the etching gas is supplied at 400 mL/min. As indicated in a time period (c) in FIG. 2A, for 15 minutes from the end of the transition etching condition, the pressure in the chamber 20 is regulated to 3 Pa. Further, as indicated in the time period (c) in FIG. 2B, the unit processing period is fixed to 4 seconds for 15 minutes from the end of the transition etching condition. In this period, applied to the coil 24 is a high-frequency electric power at 13.56 MHz of 2200 W. Applied to the stage 21 is a high-frequency electric power at 380 kHz of 45 W. Under the low-rate etching condition according to the present embodiment, the etching rate is about 5.5 μm/min at the trench of approximately 100 μm in width, while the etching rate at the trench of approximately 10 μm in width is about 3 μm/min until the trench of approximately 100 μm in width reaches the etch stop layer 18, and is changed to about 5 μm/min thereafter.

Figure 3C:
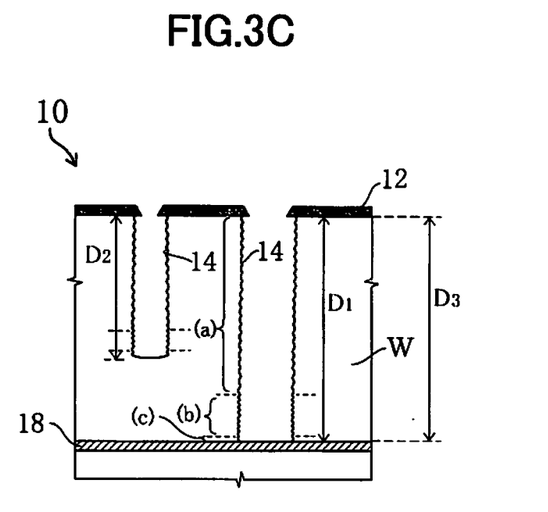
FIG. 3C is a cross sectional view showing a process in the method for manufacturing the silicon structure according to the embodiment of the present invention.
Figure 3D:
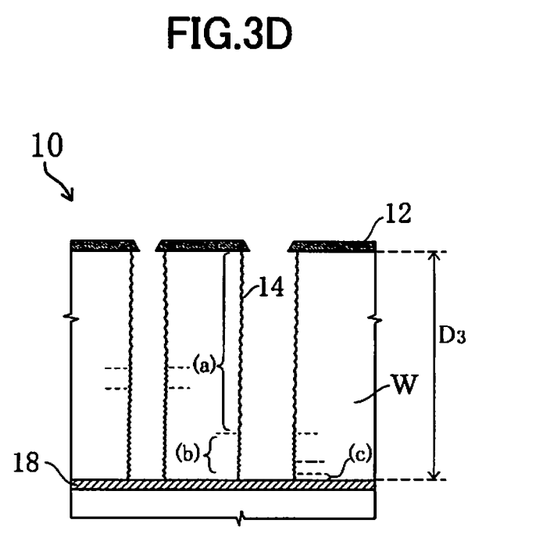
FIG. 3D is a cross sectional view showing a process in the method for manufacturing the silicon structure according to the embodiment of the present invention.

FIGS. 3C and 3D are cross sectional views each showing the silicon structure 10 that is etched under the high-rate to low-rate etching conditions. There is formed the region (b) of each of the trenches under the transition etching condition, and is then formed a region (c) of the trench under the low-rate etching condition. In this case, under the low-rate etching condition, the bottom part of the trench formed at the lowest etching rate is etched to reach the etch stop layer 18. In the present embodiment, there was formed no notch although over etching was performed for about three minutes after the bottom part of the trench formed at the lowest etching rate had reached the etch stop layer 18 (FIG. 3D). As in the present embodiment, in a case where the etching gas is kept to have a substantially constant pressure under the low-rate etching condition, the plasma state during the etching process is stabilized, which is preferable because of remarkable easiness in management of the etching period with use of a known etching endpoint detector.

Figure 4A:
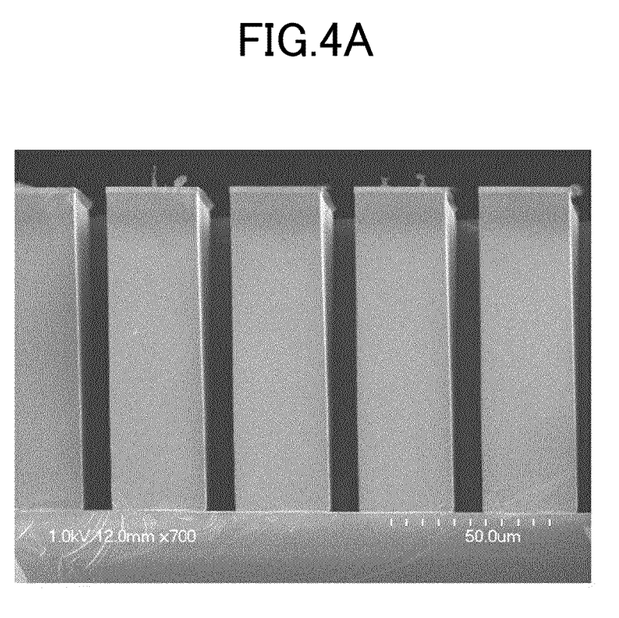
FIG. 4A is a SEM picture showing shapes of side walls of trenches provided in a silicon structure according to an embodiment of the present invention.
Figure 4B:
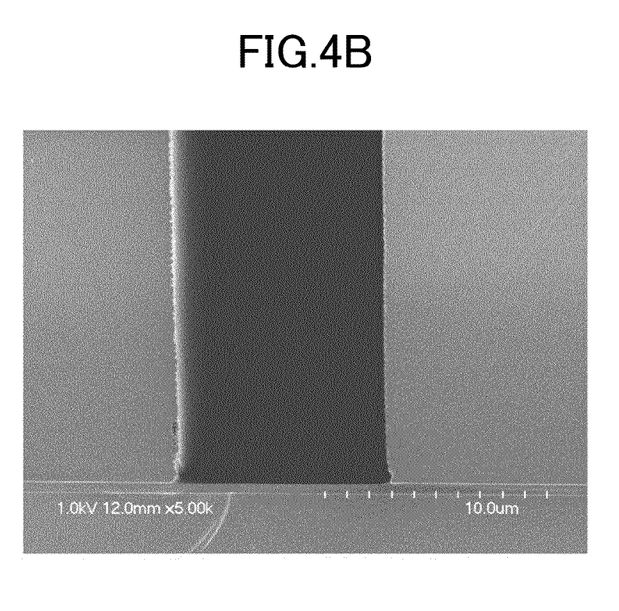
FIG. 4B is a SEM picture showing a shape of a side wall in the vicinity of an interface between a silicon layer and an etch stop layer in a trench provided in a silicon structure according to an embodiment of the present invention.

FIGS. 4A and 4B are cross sectional SEM pictures each showing part of the silicon structure 10 that is formed by dry etching according to the present embodiment. More specifically, FIG. 4A is the SEM picture showing the shapes of the side walls of the trenches provided in the silicon structure 10, while FIG. 4B is the SEM picture showing the shape of the side wall in the vicinity of the interface between the silicon layer and the etch stop layer in the trench provided in the silicon structure 10. As observed in these pictures, the etching process according to the present embodiment provides the significantly preferable shapes of the side walls as well as the shape in the vicinity of the interface between the silicon and the etch stop layer with no notch being formed.

The control unit 29 included in the above manufacturing apparatus 100 is connected to a computer 60. This computer 60 monitors or performs total control on the respective processes described above with use of a manufacturing program for the silicon structure 10 which is used to execute the respective processes. Described below is the manufacturing program for the silicon structure 10 with reference to a specific manufacturing flowchart. In the present embodiment, the above manufacturing program is stored on a known recording medium such as an optical disk to be inserted into a hard disk drive in the computer 60 or into an optical disk drive or the like which is provided to the computer 60. However, the location of storing the manufacturing program is not limited to such cases. For example, the manufacturing program may be partially or entirely stored in the control unit 29 that is provided in the process chamber according to the present embodiment. Further alternatively, this manufacturing program may monitor or control the respective processes described above by way of a local area network, an internet connection, or the like according to a known technique.

Figure 5:
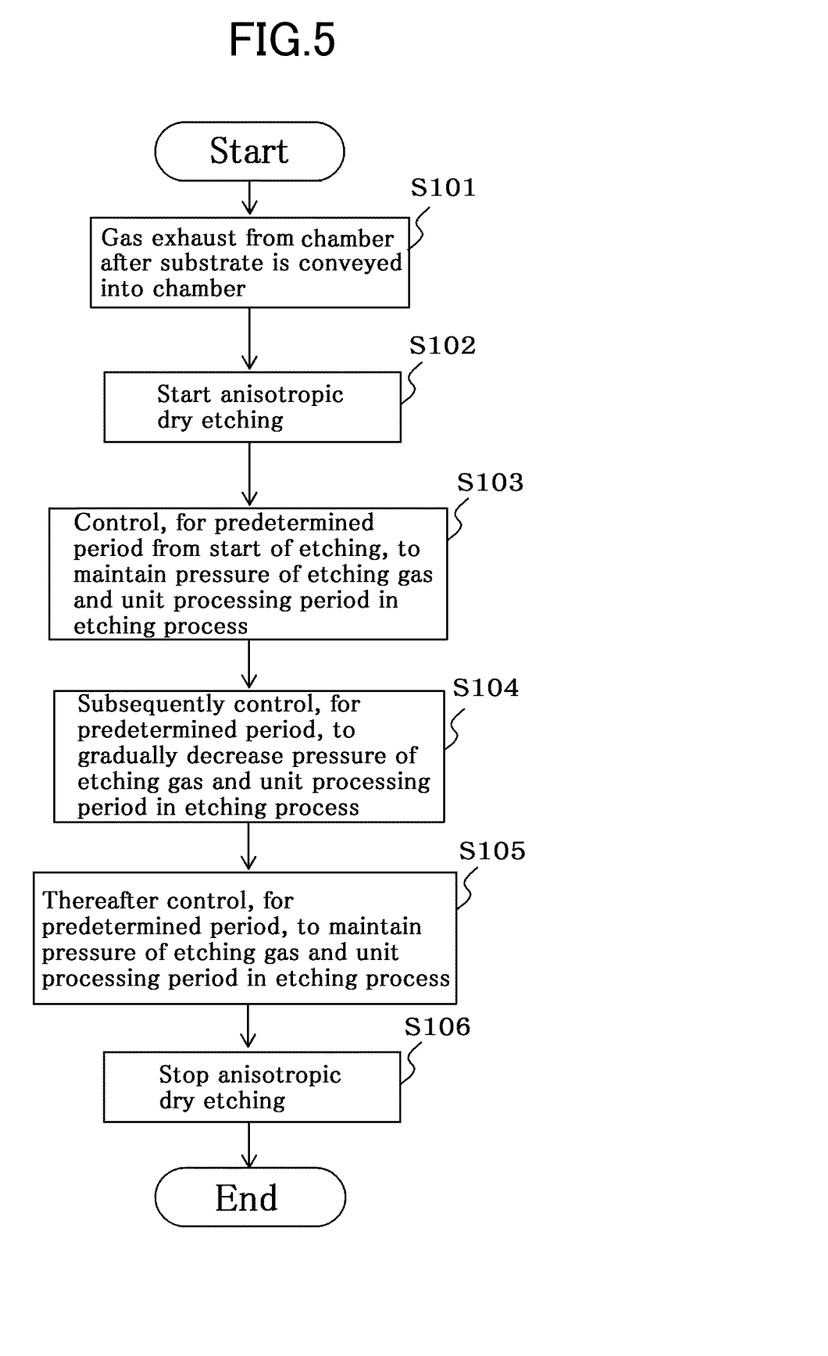
FIG. 5 is a flowchart of manufacturing a silicon structure according to an embodiment of the present invention.

FIG. 5 is a flowchart of manufacturing the silicon structure 10 according to the present embodiment.

As shown in FIG. 5, upon execution of the manufacturing program for the silicon structure 10 in the present embodiment, initially in step S101, the silicon substrate W is conveyed into the chamber 20 and then the gas in the chamber 20 is exhausted. Then in steps S102 to S105, anisotropic dry etching is applied to the silicon substrate W in the chamber 20 under the conditions described earlier.

More specifically, first in step S102, the etching according to the present embodiment starts. For a predetermined time period from the start of the etching (for example, for 20 minutes from the start of the etching in the present embodiment), the program of the present embodiment controls, as shown in step S103, to maintain the pressure of the etching gas in the etching process as well as the unit processing period in the process. This stage corresponds to the process under the high-rate etching condition described above.

Then, as shown in step S104, the program of the present embodiment controls to gradually reduce the pressure of the etching gas in the etching process as well as the unit processing period in the process. This stage corresponds to the process under the transition etching condition described above.

Thereafter, as shown in step S105, the program of the present embodiment controls to maintain the pressure of the etching gas in the etching process as well as the unit processing period in the process. This stage corresponds to the process under the low-rate etching condition described above. The program of the present embodiment then stops the process of anisotropic dry etching (S106), which is the end of the program in the present embodiment. FIG. 5 refers particularly to transitions of two parameters in the etching process, while this manufacturing program performs total control on other conditions such as the respective conditions in the protective film formation process. As already described, execution of the manufacturing program for the silicon structure 10 results in high verticality as well as the side walls in the preferable shapes.

The above embodiment changes the pressure of the etching gas as well as the unit processing period in the etching process as measures for decreasing the etching rate, in other words, measures for reducing the etching capability. However, the present invention is not limited to such a case. For example, there is substantially exerted the effects of the present invention even by changing the ratio between the on state and the off state during the pulsed application of the electric power, since the etching rate can be decreased by such a change.

In the above embodiment, there is adopted, as a measure for etching silicon, the technique of alternately plasmatizing the etching gas and the passivation film forming gas. However, the present invention is not limited to such an etching measure. For example, it is possible to utilize in anisotropic dry etching of silicon the method of plasmatizing a mixture of an etching gas and a passivation film forming gas as described in Japanese Unexamined Patent Publication No. 2004-296474. The etching rate in this method is lower than that in the etching method of simply and alternately plasmatizing the respective gases. However, this method is effective in that the side wall surfaces can be smoother with fewer unevennesses. There may be adopted as the passivation film forming gas $C_5F_8$ or $C_4F_6$ in place of $C_4F_8$, and $NF_3$ or $F_2$ may be adopted as the etching gas in place of $SF_6$. Moreover, each of the etching gas and the passivation film forming gas may not be necessarily a single gas. For example, the etching gas may include an oxygen gas or an argon gas in addition to $SF_6$ or the like, and the passivation film forming gas may include an oxygen gas in addition to $C_4F_8$ or the like.

While the etching was performed to provide the trenches in the above embodiment, the present invention is not limited to such a case. There are exerted effects substantially same as those of the present invention even in a case where etching is performed to provide holes.

The above embodiment adopts the two widths (100 μm and 10 μm) for the apertures. However, the present invention is not limited to such a case. The present invention is applicable even to a case where there are three or more widths for the apertures. For example, in a case where etching is performed to provide a group of trenches having three aperture widths different from one another, the time periods required to reach the etch stop layer, in other words, the etching rates are different from one another. In this case, it is possible to obtain effects similar to those of the present invention by adopting a plurality of transition etching conditions. More specifically, performed after the etching process under the high-rate etching condition is an etching process under a transition etching condition of a relatively high etching rate (hereinafter, referred to as a "first transition etching condition"). Subsequently, there is performed an etching process under an etching condition of the lowest etching rate in the first transition etching condition (in this paragraph, referred to as an "intermediate etching condition" for the purpose of simplification in the description). Furthermore, through an etching process under a transition etching condition of gradually decreasing the etching rate (hereinafter, referred to as a "second transition etching condition"), there is performed an etching process under the "low-rate etching condition" of the lowest etching rate in the second transition etching condition. As a result, there are exerted effects similar to those of the present invention also in the group of trenches having the three aperture widths different from one another. Such adoption of the plurality of transition etching conditions is applicable also to a case where there are a group of trenches having a plurality of aperture widths mixed with a group of holes that have a plurality of aperture widths and have etching rates generally lower than those of the trenches.

While the above embodiment adopts an SOI substrate, the present invention is applicable also to a silicon substrate that is provided with an etch stop layer other than a silicon dioxide film.

Furthermore, the embodiment described above adopts an ICP (Inductively Coupled Plasma) as means for generating a plasma. However, the present invention is not limited to such a case. It is possible to obtain the effects of the present invention even in a case where a different high-density plasma is adopted such as a CCP (Capacitive-Coupled Plasma) or an ECR (Electron-Cyclotron Resonance Plasma). As described so far, the scope of claims also covers modifications made within the scope of the present invention.

The invention claimed is:

1. A method for manufacturing a silicon structure, the method comprising, in a process of etching a silicon region in a substrate provided with an etch stop layer with use of plasmas generated by alternately supplying an etching gas and an organic deposit forming gas, to thereby form a first opening and a second opening in the silicon region, the second opening being smaller in width than the first opening, the method comprising the steps of:

etching a portion in the silicon region at a highest etching rate under a high-rate etching condition such that the portion does not reach the etch stop layer;

subsequently etching under a transition etching condition in which an etching rate is decreased with time-dependently from the highest etching rate in the high-rate etching condition; and thereafter, etching the silicon region under a low-rate etching condition of a lowest etching rate in the transition etching condition until the second opening reaches the etch stop layer.

2. The method for manufacturing a silicon structure according to claim 1, wherein in the transition etching condition, the etching rate is decreased substantially linearly.

3. A recording medium having a manufacturing program being stored thereon, the manufacturing program comprising, in a process of etching a silicon region in a substrate provided with an etch stop layer with use of plasmas generated by alternately supplying an etching gas and an organic deposit forming gas, to thereby form a first opening and a second opening in the silicon region, the second opening being smaller in width than the first opening, the manufacturing program, when executed by a computer, causing the computer to perform the steps of:

control etching of a portion in the silicon region at a highest etching rate under a high-rate etching condition such that the portion does not reach the etch stop layer;

control subsequent etching under a transition etching condition in which an etching rate is decreased with time from the highest etching rate in the high-rate etching condition; and thereafter, control etching the silicon region under a low-rate etching condition of a lowest etching rate in the transition etching condition until the second opening reaches the etch stop layer.

4. An apparatus for manufacturing a silicon structure, comprising:

a control unit in which is stored a program comprising, in a process of etching a silicon region in a substrate provided with an etch stop layer with use of plasmas generated by alternately supplying an etching gas and an organic deposit forming gas, to thereby form a first opening and a second opening in the silicon region, the second opening being smaller in width than the first opening, the program, when executed by the control unit, causing the control unit to perform the steps of:

control etching of a portion in the silicon region at a highest etching rate under a high-rate etching condition such that the portion does not reach the etch stop layer;

control subsequent etching under a transition etching condition in which an etching rate is decreased with time from the highest etching rate in the high-rate etching condition; and thereafter, control etching of the silicon region under a low-rate etching condition of a lowest etching rate in the transition etching condition until the second opening reaches the etch stop layer.

5. An apparatus for manufacturing a silicon structure, comprising:

a control unit which uses the recording medium of claim 3 for controlling the apparatus for manufacturing a silicon structure.

6. The method according to claim 1, wherein the low-rate etching results in etching of the second opening down to the etch stop layer, while at a same time causing little if any excess etching of the first opening that has been previously etched down to the etch stop layer.

* * * * *